United States Patent [19]
Uomi et al.

[11] Patent Number: 5,073,892
[45] Date of Patent: Dec. 17, 1991

[54] SEMICONDUCTOR LASER DEVICE

[75] Inventors: Kazuhisa Uomi, Hachioji; Tsukuru Ohtoshi, Kokubunji; Tomonobu Tsuchiya, Kodaira; Shinji Sasaki, Komoro; Naoki Chinone, Chofu, all of Japan

[73] Assignee: Hitachi, Ltd., Tokyo, Japan

[21] Appl. No.: 534,441

[22] Filed: Jun. 7, 1990

[30] Foreign Application Priority Data

Jun. 12, 1989 [JP] Japan .................................. 1-146611
Dec. 4, 1989 [JP] Japan .................................. 1-313303

[51] Int. Cl.$^5$ .............................................. H01S 3/19
[52] U.S. Cl. ....................................... 372/45; 372/46; 372/26; 372/28
[58] Field of Search ...................... 372/45, 46, 26, 28, 372/29, 32; 357/16, 17

[56] References Cited

U.S. PATENT DOCUMENTS

| | | | |
|---|---|---|---|
| 4,408,330 | 10/1983 | An ........................................ | 372/45 |
| 4,700,353 | 10/1987 | Van Gieson et al. ................. | 372/26 |
| 4,908,833 | 3/1990 | Chraplyuy et al. ................... | 372/46 |
| 4,928,285 | 5/1990 | Kushibe et al. ...................... | 372/45 |

FOREIGN PATENT DOCUMENTS 0276140  7/1988  European Pat. Off. .

OTHER PUBLICATIONS

Oyo, Buturi, vol. 55, No. 3, Mar. 3, 1986, a monthly publication of the Japan Society of Applied Physics.
Patent Abstracts of Japan, vol. 12, No. 111, Aug. 8, 1988, JP-A-62242379 )Omron Tateisi Electronics Co.).
Patent Abstracts of Japan vol. 12, No. 124, Apr. 23, 1986, JP-A-62249496 (Hatachi Ltd.).
Japanese Journal of Applied Physics/Part 2: Letters, vol. 26, No. 2, Feb. 1987, pp. L117-L119, Tokyo, JP; T. Takeoka et al: "A 140 ps optical pulse generation by field-induced gain switching in a photo-excited quantum well Laser".
Patent Abstracts of Japan vol. 10, No. 129, May 14, 1986; JP-A-60260181 (Fujitsu K.K.).

*Primary Examiner*—Georgia Epps
*Attorney, Agent, or Firm*—Kenyon & Kenyon

[57] ABSTRACT

A semiconductor laser device of the field modulation type includes a structure in which the threshold carrier density for laser oscillation is reduced so as to enable an effective action of a modulated electric field applied externally on an active region for radiating light, thereby enabling an extremely high speed modulation. A quantum structure which does not fulfill the charge neutrality condition for free-carriers or a strained super lattice structure is adopted as the structure in which the threshold carrier density is reduced.

21 Claims, 7 Drawing Sheets

SEMICONDUCTOR LASER DEVICE

BACKGROUND OF THE INVENTION

1. Field of the Invention

This invention relates to a semiconductor laser device capable of being used for optical fiber communication which needs ultra high speed optical modulation, or for optical logic circuits, optical connection, etc., utilized in optical computers.

2. Description of the Related Art

Hitherto, a method of modulating the intensity of output power from a quantum well by applying an electric field to a quantum well structure in the lamination direction of the structure to vary the quantum states has been practiced, and discussed in Oyo Butsuri [Journal of Applied Physics (Japan)], Vol. 55, p. 210, 1986. The principle of modulation used in the method will be explained below while referring to FIGS. 2A and 2B. Referring to FIG. 2A, there are shown the quantum level (broken line) and the wave functions of electrons and holes, under zero applied electric field. Both the electrons and holes are localized in the quantum well layer, and the wave functions thereof are each symmetrical with respect to the center of the well. When an electric field is applied in the lamination direction of the quantum well structure, on the other hand, the energy bands are inclined as shown in FIG. 2B, so that the symmetry of the wave functions is lost. That is, the wave function of electrons is localized to the left side where the energy is lower, whereas the wave function of holes is localized to the right side, as shown in the figure. In other words, the position of electrons and the position of holes differ from each other on a spatial basis, as shown in FIG. 2B.

In this specification, the difference between the peak position of the wave function of electrons and the peak position of the wave function of holes is defined as the "distance between the position of electrons and the position of holes", as shown in FIG. 2B. Thus, when an electric field is applied externally in the lamination direction of the quantum well structure as mentioned above, the wave function of electrons and the wave function of holes are spatially separated from each other in the quantum well. That is, the "distance between the position of electrons and the position of holes" is increased. As a result, the spatial overlap of the wave function of electrons and the wave function of holes is decreased, resulting in a decrease in the probability of optical transition, namely, in the oscillation strength. In short, the intensity of output power is varied depending on whether an electric field is present or not. The speed of modulation, or the rate of variation in the intensity of output power depending on the presence or absence of an electric field, is extremely high—on the order of picoseconds. Thus, it is possible to increase the modulation speed by one or two orders of magnitude, as compared with the speed attained in a direct modulation system of semiconductor laser according to the prior art.

SUMMARY OF THE INVENTION

When the above-mentioned modulation system is applied to a semiconductor laser having an ordinary quantum well structure, the presence of electrons and holes localized in the quantum well cancels the electric field applied to the well (screening effect), thereby weakening the net strength of the applied electric field. That is, the carrier density required for laser oscillation is about $2 \times 10^{18}$ cm$^{-3}$, and, under such a high carrier density as this, the modulation of intensity of output power of a quantum well by application of an electric field becomes impossible due to the screening. It was found, as a result of the present inventors' studies, that the above-mentioned modulation method according to the prior art is usable only in a spontaneous light radiation condition, namely, before laser oscillation, and it is difficult to apply the method to modulation of a semiconductor laser device.

The present invention contemplates a solution to the above-mentioned technical problems involved in the prior art.

It is accordingly an object of the present invention to provide a novel structure of semiconductor laser device which is capable of modulating the intensity of output power from a quantum well by application of an electric field, even in a laser oscillation condition, as shown in FIGS. 2A and 2B.

According to one aspect of the present invention, there is provided a semiconductor laser device comprising an active region for radiating light, means for injecting carriers into the active region, a resonator for amplifying the light radiated from the active region, and means for applying a modulated electric field to the active region. The active region has a potential well which comprises electrons and holes, and a structure in which the distance between the position of electrons and the position of holes is varied in the potential well by the electric field applied from the electric field applying means. In the present invention, the position of the electrons and the position of the holes are controlled by an electric field to vary the spatial overlap of the wave functions which respectively described the electrons and the holes, as shown in FIGS. 2A and 2B, so as to control the radiation of light based on recombination of the carriers. In the present invention, electric field modulation is selected for realizing an ultra high speed optical modulation in a laser oscillation mode. By adoption of the active region in which the threshold carrier density for laser oscillation is such as to not cause effective screening of a modulated electric field, a typical value of the carrier density being less than $1 \times 10^{18}$ cm$^{-3}$, it is possible to realize the ultra high speed optical modulation by an electric field.

According to one specific aspect of the present invention, there is provided a semiconductor laser device wherein the above-mentioned active region has a potential well comprising a region which does not fulfill the charge neutrality condition for free-carriers, and the optical output power is reduced by applying an electric field in such a direction as to enlarge the distance between the position of electrons localized in the potential well and the position of holes localized in the potential well. In the present invention, electric field modulation is selected for realizing the ultra high speed optical modulation in the laser oscillation mode.

The potential well comprising the region not fulfilling the charge neutrality condition is a representative form of structure for reducing the threshold carrier density for laser oscillation, as described in detail below, which ensures an effective action of a modulated electric field, thereby enabling the ultra high speed optical modulation in a laser oscillation mode.

According to another specific aspect of the present invention, there is provided a semiconductor laser device wherein the above-mentioned region, not fulfilling, the charge neutrality condition for free-carriers is formed by selective introduction of a conductivity type impurity into the potential well. In this case, the density of the conductivity type impurity is desirably not less than $1 \times 10^{18}$ cm$^{-3}$. The introduction of an n-type impurity, which has a greater effect on reduction of the threshold carrier density for laser oscillation, is particularly suitable for the electric field modulation used in the present invention. The impurity density is desirably not less than $1 \times 10^{18}$ cm$^{-3}$ in the case of an n-type impurity, and not less than $2 \times 10^{18}$ cm$^{-3}$ in the case of a p-type impurity. A remarkable effect is obtained with an n-type impurity used in a density of not less than $2 \times 10^{18}$ cm$^{-3}$ or with a p-type impurity used in a density of not less than $5 \times 10^{18}$ cm$^{-3}$.

According to a further specific aspect of the present invention, there is provided a semiconductor laser device wherein the above-mentioned region not fulfilling the charge neutrality condition for free-carriers is formed by selective introduction of a conductivity type impurity into the vicinity of the potential well in the active region.

According to yet another specific aspect of the present invention, there is provided a semiconductor laser device wherein the above-mentioned region not fulfilling the charge neutrality condition for free-carriers is based on an asymmetric nature of the shape of the potential well. By appropriately devising energy band structure of the quantum well or the vicinity thereof, it is possible to obtain a condition where the distance between the position of electrons and the position of holes in the potential well is enlarged under zero applied electric field. A laser oscillation condition is obtained by application of an electric field for modulation, in such a direction that the overlap of the wave functions of the electrons and holes is enlarged in the well.

According to another aspect of the present invention, there is provided a semiconductor laser device comprising an active region for radiating light, means for injecting carriers into the active region, and a resonator for obtaining laser light from the radiated light, the active region having a potential well, the potential well comprising a region which does not fulfill the charge neutrality condition for free-carriers, and optical output power of the device being modulated by applying an electric field to the carriers in the potential well. Further, there is provided a semiconductor laser device wherein the region not fulfilling the charge neutrality condition is formed by introducing a conductivity type impurity into the active region.

According to a further aspect of the present invention, there is provided a semiconductor laser device comprising an active region for radiating light, means for injecting carriers into the active region, and a resonator for obtaining laser light from the radiated light, a conductivity type impurity being introduced into the active region, whereby optical output power of laser is modulated by a modulated electric field applied to the active layer.

According to another specific aspect of the present invention, there is provided a semiconductor laser device wherein the conductivity type impurity is introduced so as to cancel a screening effect of the carriers present in the active region on the modulated electric field.

According to still another specific aspect of the present invention, there is provided a semiconductor laser device in which the optical output power of light oscillated by injection of carriers is modulated by an applied electric field, wherein the optical output power is substantially eliminated by varying the magnitude of the applied electric field to enlarge the average distance between electrons and holes to be recombined in an active region.

According to a specific aspect of the present invention, there is provided a semiconductor laser device wherein the optical output power is modulated by the applied electric field while a substantially constant driving current in the vicinity of a threshold current for radiation of laser light is injected.

According to yet another aspect of the present invention, there is provided a semiconductor laser device comprising an active region, the active region having a potential well, the potential well comprising a region which does not fulfill the charge neutrality condition for free-carriers, means for injecting carriers into the active region to cause radiation of light, a resonator for obtaining laser light from the radiated light, and means for applying an electric field to the active region in order to modulate the radiation of the light.

According to a further aspect of the present invention, there is provided a semiconductor laser device comprising an active region for radiating light, means for injecting carriers into the active region, a resonator for obtaining laser light from the radiated light, and means (for instance, electrodes) for applying an electric field for modulation to the active region, wherein the active region has a strained super lattice structure which is of a structure that causes laser oscillation with such a low carrier density as not to cause a substantial screening of an applied electric field, and the optical output power of the device is modulated by varying the distance between the position of electrons and the position of holes present in the active region by the electrodes or the like. In general, the electric field applied to a quantum well is canceled when the carrier density is not less than $10^{18}$ cm$^{-3}$. Therefore, the intended object is attainable by forming an active region (quantum well structure) capable of oscillation with carrier density of the order of $10^{17}$ cm$^{-3}$ by use of a strained super lattice and providing electrodes for applying an electric field for modulation.

One advantage of the present invention is that it is possible to realize a semiconductor laser device which is capable of varying a quantum state by application of an electric field to a potential well, thereby modulating the intensity of output power at high speed in a laser oscillation condition.

Another advantage of the present invention is that it is possible to realize a semiconductor laser device in which the spectral chirping at the time of modulation is extremely small. Though the limit of transmission distance in the conventional optical communication is determined by the wavelength dispersion of an optical fiber, the use of the present invention reduces the influence of the wavelength dispersion, thereby enabling dispersion-free transmission.

Still another advantage of the present invention is that it is possible to realize a semiconductor laser device suitable for ultra high speed optical fiber communication or for optical connection in computers.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangments of parts. The drawings are only for purpose of illustrating the preferred embodiments and are not to be construed as limiting the invention.

DETAILED DESCRIPTION

A system which does not fulfill the charge neutrality condition for free-carriers in a potential well means a system which satisfies the following inequality:

$$(n_0 - n_1) \neq (p_0 - p_1)$$

where $n_1$ and $p_1$ are the densities of injected electrons and holes, and $p_0$ and $p_1$ are the densities of electrons and holes under an uninjected condition. However, the system not fulfilling the charge neutrality condition, referred to in the present invention, means a system in which the deviation of the above inequality from the corresponding equality is typically not less than $1 \times 10^{18}$ cm$^{-3}$, that is, $$|(n_0 - n_1) - (p_0 - p_1)| > 1 \times 10^{18} \text{ cm}^{-3}.$$

Figure 2A:
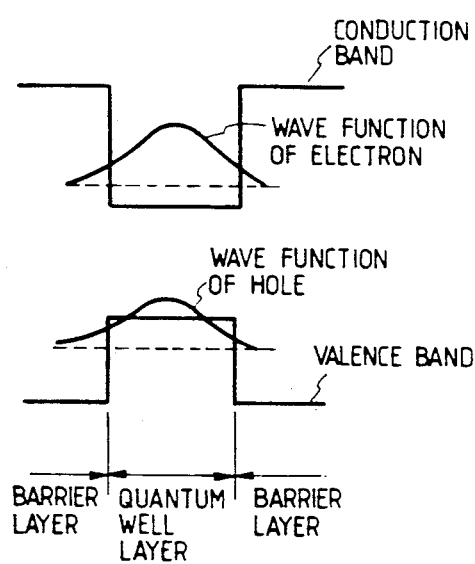
FIGS. 2A and 2B are diagrams for illustrating the fundamental principle of operation of the invention, particularly illustrating the behavior of electrons and holes under zero applied electric field and under a nonzero applied electric field, respectively.
Figure 2B:
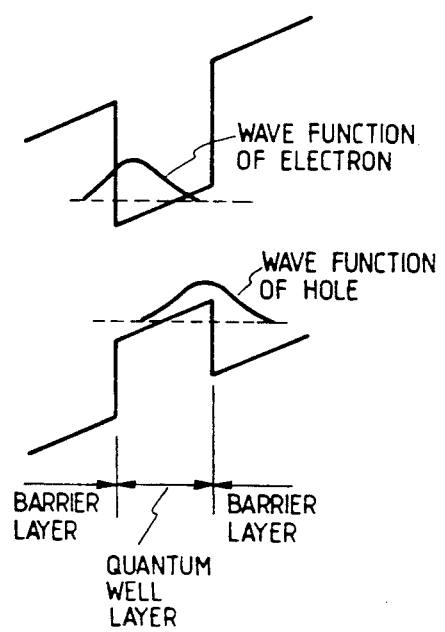
Figure 3:
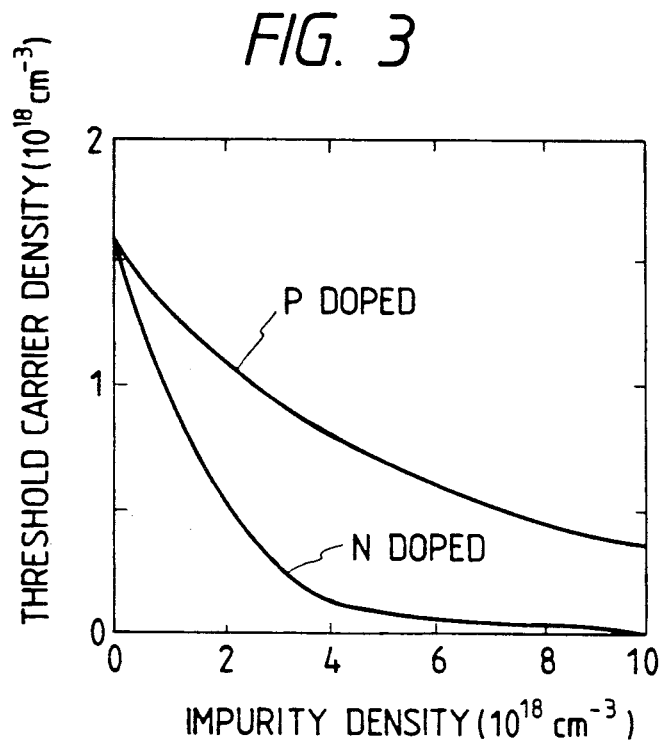
FIG. 3 is a diagram showing the relationship between doping density and threshold carrier density.

The present inventors have presented the idea that an introduction of impurity into a quantum well structure enables a considerable lowering in the carrier density necessary for laser oscillation, namely, the threshold carrier density [Shin-Gaku Giho (Technical Research Reports of the Institute of Electronics and Communication Engineers of Japan), OQE86-63]. The present invention realizes the idea in an electric field modulation type semiconductor laser device. The lowering of the threshold carrier density is based on the effect of impurity doping, that is, the effect of reducing the stimulated absorption term and increasing the optical gain at a given injected carrier density. This effect is shown in FIG. 3. Because a laser oscillation condition is obtained at a low carrier density, an electric field externally applied to the well for the purpose of modulation is not canceled by the movement of carriers localized in the well. As a result, it is possible to control the spatial overlap of the wave function of electrons and the wave function of holes. FIGS. 2A and 2B show the distributions of the electrons and holes localized in a potential well, in the absence of any applied electric field and in the presence of an applied electric field, respectively. Thus, it is possible to perform a high-speed modulation by an electric field.

Figure 6A:
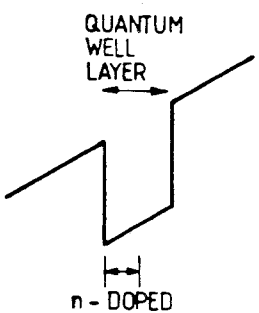
FIGS. 6A to 6H are diagrams showing various forms of a potential well structure provided in an active region employed in the semiconductor laser device according to the present invention.
Figure 6B:
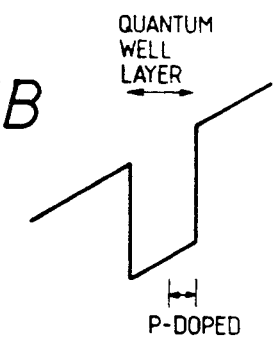
Figure 6C:
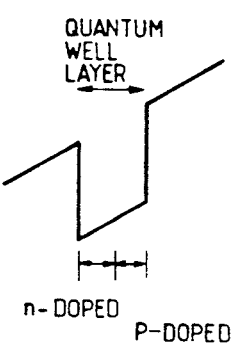
Figure 6D:
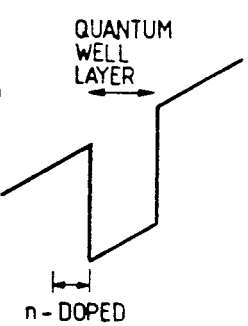
Figure 6E:
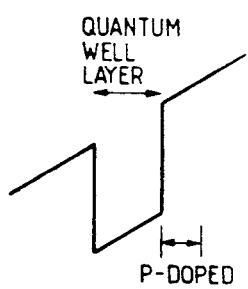
Figure 6F:
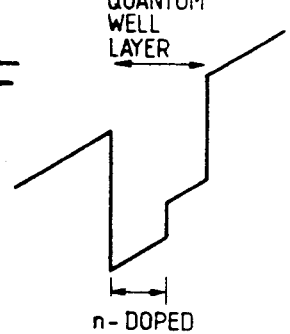
Figure 6G:
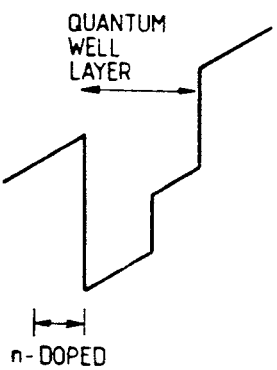
Figure 6H:
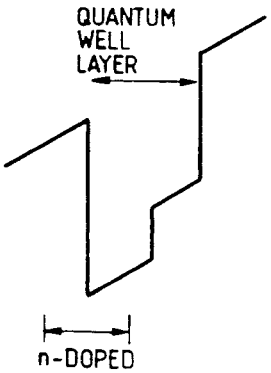

The shapes of the impurity-doped portion and the potential well may take a variety of forms, as exemplified in FIGS. 6A to 6H. Particularly, each of the figures shows a system in which the distribution of a conductivity type impurity introduced into the potential well or into the vicinity of the well is partialized to develop such a potential field that the carriers localized in the well are separated according to the polarity thereof. By forming this structure, it is possible to easily separate the electrons and holes from each other. Besides, as shown in FIGS. 6F, 6G and 6H, it is also an effective means for accomplishing the same purpose to maintain the distance between electrons and holes by providing a step in the potential well, thereby partializing the distribution of, for example, the electrons. The molulation in the present invention is carried out by externally applying an electric field for modulation to the potential well by a means for applying electric field. It is possible to render the laser oscillation substantially zero, by application of a modulated electric field. The expression "substantially zero" used herein means that it is possible to eliminate stimulated emission (all the emissions other than spontaneous emission). The means for applying electric field may comprise, for instance, at least one pair of elecrodes disposed respectively on the upper and lower sides of the potential well.

Figure 10:
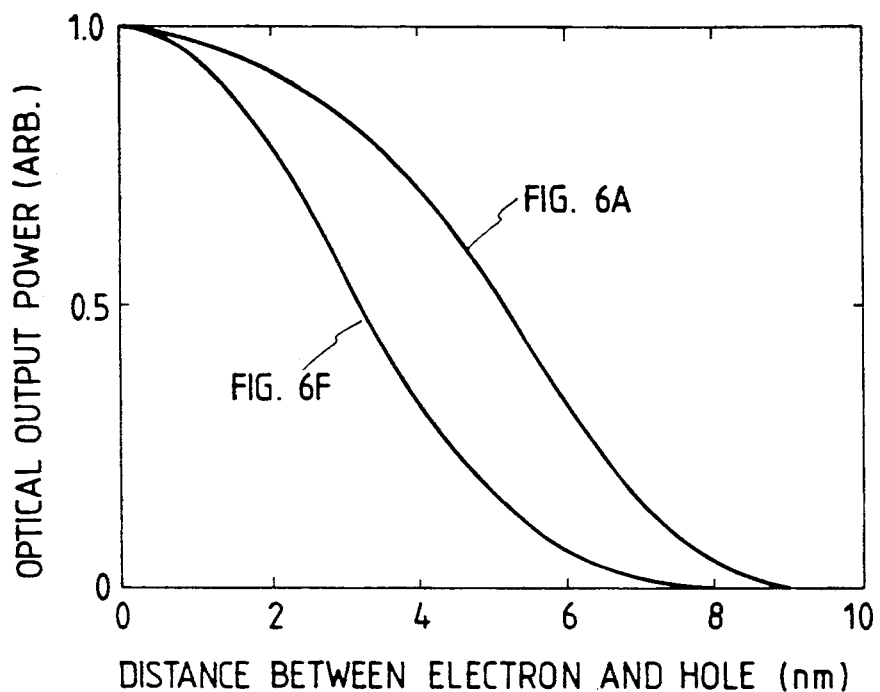
FIG. 10 is a diagram showing the relationship between the distance between the position of electrons and the position of holes and optical output power.

FIG. 10 shows the relationship of the distance between the position of electrons and the position of holes, with optical output power. The data given here was obtained where the thickness of the quantum well layer was 10 nm. The two curves show the values obtained with potential well structures corresponding to FIG. 6A and FIG. 6F, respectively. In the graph corresponding to FIG. 6F, the thickness of the well layer is the total thickness of the stepped well (two-stage well). As shown in the figure, the optical output power decreases with an increase in the distance. The difference between the structure of FIG. 6A and the structure of FIG. 6B, as seen in FIG. 10, is based on the stepped well (two-stage well) structure of FIG. 6F, in which electrons are liable to drop into the lower well portion (the deepest portion) of the stepped well, resulting in a partialized distribution of electrons.

Some preferred embodiments of the present invention will now be explained while referring to the drawings.

Figure 1:
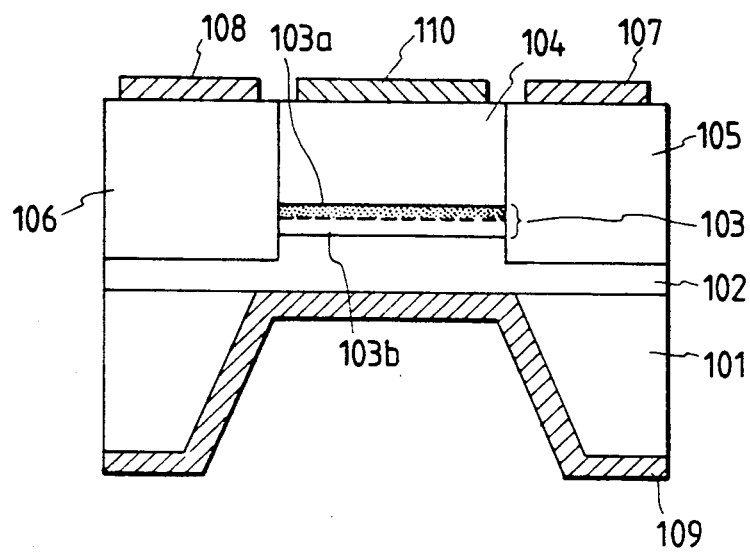
FIG. 1 is a sectional view showing one embodiment of the semiconductor laser device according to the present invention.

In FIG. 1, an undoped GaAlAs clad layer 102, a GaAs quantum well layer 103 with 5 to 20 nm thickness and an undoped GaAlAs clad layer 104 are grown on a semi-insulating InP substrate 101. In this case, the GaAs quantum well layer 103 is formed with two regions, namely, an undoped GaAs layer 103b and an n-type GaAs layer 103a doped with an n-type impurity, which is Se, Te or Si, with an impurity density of $1\times10^{18}$ to $1\times10^{19}$ cm$^{-3}$. This structure corresponds to FIG. 6A.

That is to say, in this embodiment a charge neutrality condition is established in which the electron density in the well is higher than the hole density in the well. Thereafter, a projected stripe having a width of 0.5 to 5 μm and penetrating at least the GaAs quantum well layer 103 is formed. Then, a p-GaAlAs buried layer 105 and an n-GaAlAs buried layer 106 are formed, followed by formation of a p-current injection electrode 107 and an n-current injection electrode 108. Further, the semi-insulating substrate 101 in the region corresponding to the projected stripe is removed by selective etching, and electrodes for applying electric field 109 and 110 are formed. Finally, the system thus obtained is cleaved to obtain a cavity length of 100 to 500 μm.

Figure 8:
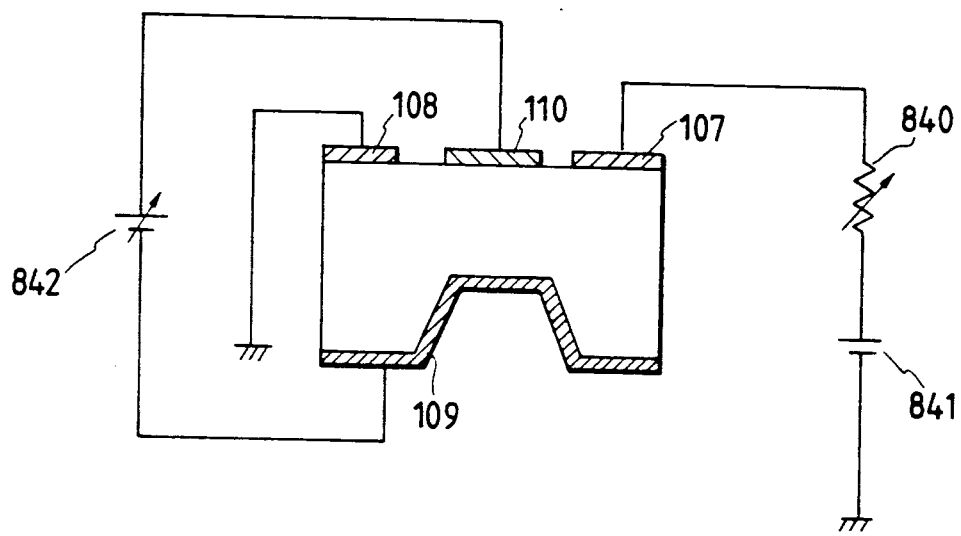
FIG. 8 is a diagram showing an arrangement of a peripheral circuit for the semiconductor laser device according to the present invention.

The device produced as above on an experimental basis performs laser oscillation with 2 to 15 mA. FIG. 8 shows a driving system, or peripheral circuit, for this embodiment. Electrodes 107, 108, 109 and 110 correspond to those in FIG. 1, the electrode 108 being grounded. A current injection source 841 having a function of controlling the current injection quantity by a variable resistor 840 is connected to the electrode 107. The electrodes 109 and 110 for applying an electric field to the quantum well are connected with an electric field application source 842. When the electrode for applying electric field 109 was grounded and a voltage of 2V was applied to the other electrode for applying electric field 110 during laser oscillation at an output of 1 to 5 mW, the laser oscillation ceased and the optical output power was reduced to zero. It was thus possible to modulate the intensity of laser output power according to the presence or absence of an electric field applied to the electrode 110. The switching speed in this case was about 5 ps, the value being restricted by the CR time constant of the device.

Figure 4:
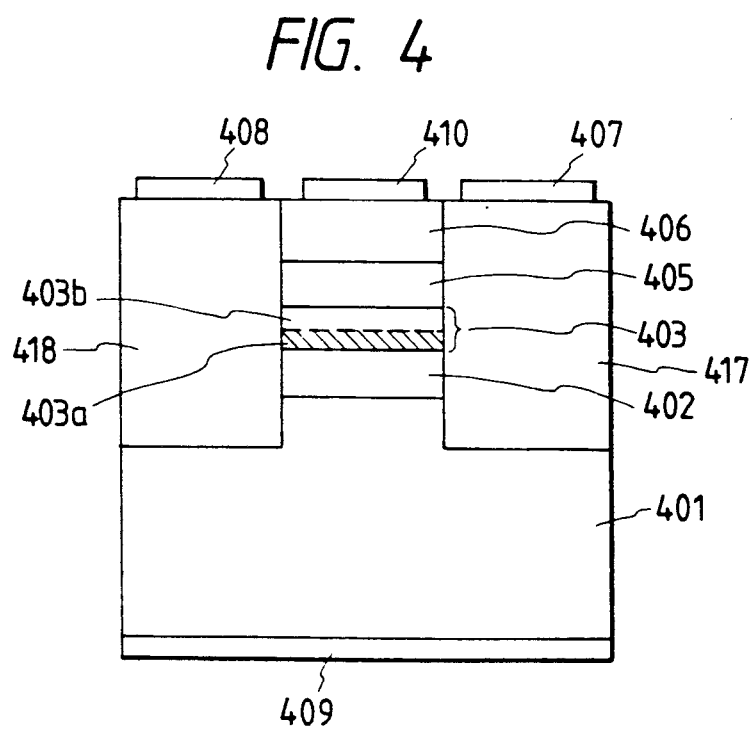
FIGS. 4, 5A and 5B are sectional views showing other embodiments of the present invention.
Figure 9:
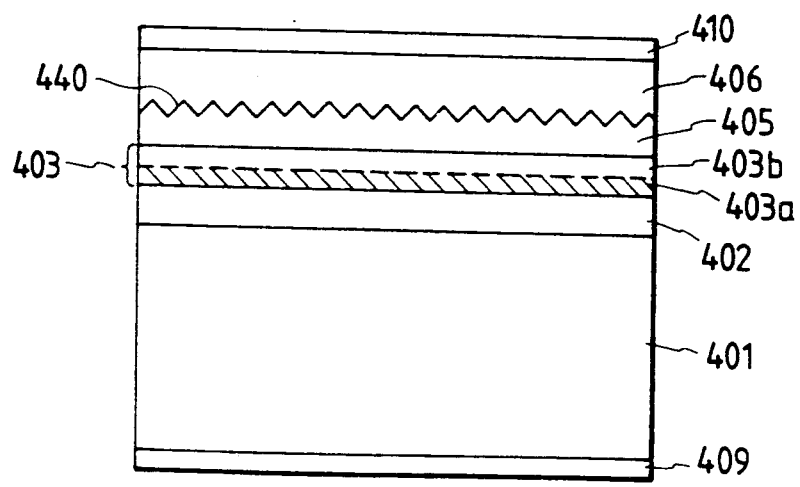
FIG. 9 is a cross-sectional view of the device shown in FIG. 4, taken along the direction of a cavity.

Another embodiment of the semiconductor laser device according to the present invention is illustrated in FIG. 4, and FIG. 9 shows a cross-sectional view of the device, taken along the direction of a cavity. This embodiment exemplifies an application of the semiconductor laser device of the invention to an InGaAsP DFB laser. An undoped InP layer 402 with 0.05 to 0.3 μm thickness, an InGaAs or InGaAsP quantum well layer 403 with 5 to 15 nm thickness and an undoped InGaAsP optical guide layer 405 with 0.05 to 0.3 μm thickness are grown on an n-InP substrate 401. Then, a grating 440 with a period of about 240 nm is formed on the optical guide layer 405. Thereafter, a p-InP optical confinement layer 406 is grown. Here, the quantum well layer 403 is formed with two regions, namely, a p-type region 403a and an undoped region 403b. The doping density of the p-type region 403a is about $2\times10^{18}$ to $1\times10^{19}$ cm$^{-3}$. This structure corresponds to FIG. 6B. Next, a projected stripe having a width of 0.5 to 3 μm and penetrating the grown layers is formed, and then a p-InP buried layer 417 and an n-InP buried layer 418 are grown. Then, a p-current injection electrode 407 and an n-current injection electrode 408 are formed, and electrodes for applying electric field 409 and 410 are formed. Finally, the system thus obtained is cut to a device length of 100 to 1000 μm. The formation direction (the direction of grooves) of the grating is orthogonal to the stripe. In this device, the quantum well layer 403 is sandwiched in a p/n junction, and an electric field is therefore applied to the quantum well layer 403 due to a built-up potential, without any voltage applied between the electrodes 409 and 410. Accordingly, when a voltage of +1V is applied to the electrode 410, the energy band in the quantum well layer becomes flat.

The device produced as above on an experimental basis performs laser oscillation with 5 to 10 mA. In this case, the spectrum obtained indicates a single mode, which reflects the DFB structure. When a voltage of $-2$ to $-3$V is applied to the electrode for applying electric field 410 during laser oscillation at an optical output power of 5 mW effected by grounding the electrode for applying electric field 409 and applying $+1$V to the electrode 410, the laser oscillation ceases and the optical output power is reduced to zero. This switching takes place very rapidly, in 2 to 3 ps. In addition, the spectral chirping in this case is extremely small and is exactly the same as the chirping due to a limit of modulation.

Figure 5A:
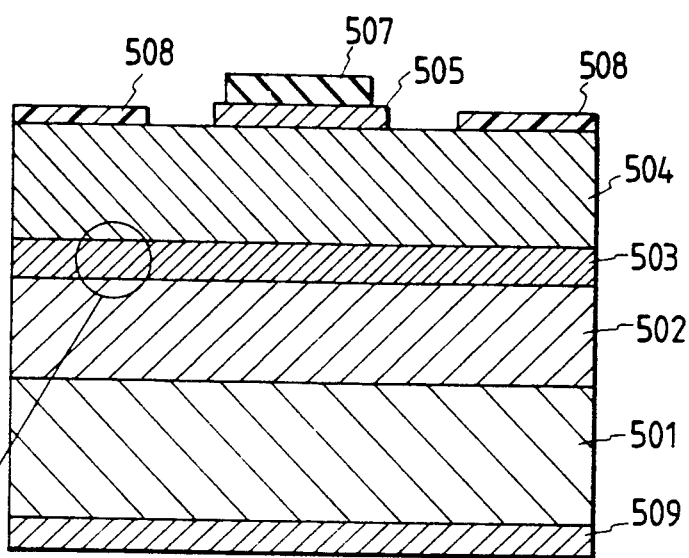
Figure 5B:
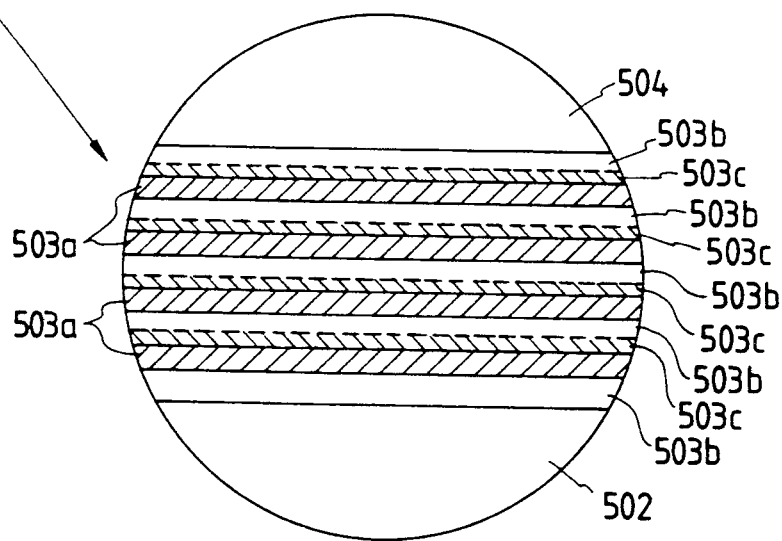

A further embodiment of the present invention is illustrated in FIGS. 5A and 5B. This embodiment has a structure resembling a two-dimensional electron gas hetero-bipolar transistor having an emitter, a base and a collector. After a p-GaAlAs layer 502, a modulation doped multiple quantum well active layer 503, an n-GaAlAs 504 and a p-GaAs 505 are grown on a p-GaAs substrate 501, an emitter electrode 507 is formed. The modulation doped multiple quantum well active layer 503, as shown in detail in the circle of FIG. 5B, has a periodic structure comprising quantum well layers, each of which is composed of an undoped $Ga_{0.9}Al_{0.1}As$ layer 503b and an n doped GaAs layer 503c, and n doped $Ga_{0.7}Al_{0.3}As$ barrier layers 503a. That is, each quantum well layer is formed of two materials differing in bandgap energy, and the GaAs having the smaller bandgap energy is doped with an n-type impurity. This structure corresponds to FIG. 6H.

Next, the emitter electrode 507 and the p-GaAs 505 in the other regions than the above are removed, a base electrode 508 is formed, and a collector electrode 509 is provided on the lower side. In this device, the application of electric field to the multiple quantum well is carried out according to the presence or absence of a voltage applied to the collector electrode 509. Carrier injection into the multiple quantum well is effected through the emitter and base electrodes, and a modulation of the intensity of laser output power similar to the modulation in the above-mentioned embodiment is achieved.

Other than the forms of quantum well structure shown in the three embodiments above, a variety of quantum well structures are applicable. The applicable forms of quantum well structure are shown respectively in FIGS. 6A to 6H. Each of the figures shows the edge of the conduction band when an electric field is applied to the quantum well structure. To avoid complication, one of the quantum wells is shown in each figure. All these structures are extremely effective for the respective embodiments shown in FIGS. 1, 4, 5A and 5B.

Figure 7:
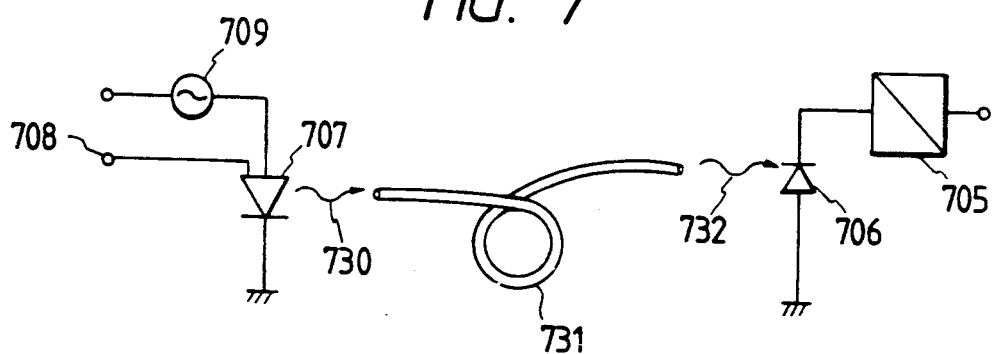
FIG. 7 is a system chart showing an embodiment of the invention in which the semiconductor laser device according to the present invention is used for optical fiber communication.

FIG. 7 illustrates an embodiment in which each of the above-mentioned semiconductor laser devices of the present invention can be applied to optical communication. To the semiconductor laser device 707 are connected a carrier injection electrode 708 and a signal generator for applying an electric field 709. Laser light 730 modulated by the optical device 707 is transmitted through an optical fiber 731, and an optical output 732 from the fiber is converted by an optical detector 706 into an electric signal, which is discriminated by a receiver 705. In this embodiment, it is possible to realize a transmission speed of 100 Gbit/s and a fiber length of 40 km.

Figure 12:
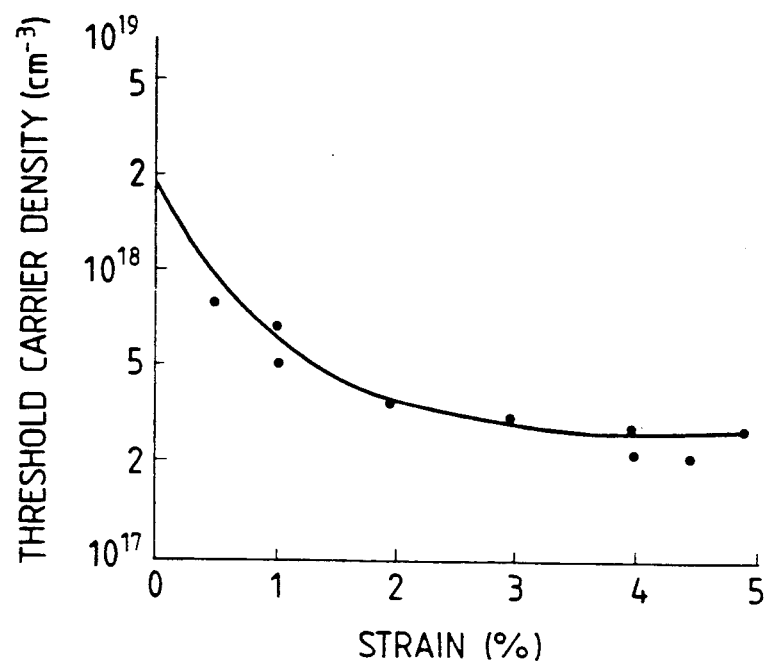
FIG. 12 is a diagram showing the relationship between strain and threshold carrier density.

Now, utilization of a strained super lattice as another form for lowering the carrier density for laser oscillation will be explained in detail below, while referring to the drawings. That is, an explanation will be given of a system in which a strained super lattice type quantum well, or a quantum well with a lattice constant differing from the lattice constant of an adjacent barrier layer, is used in an active region. In this type of semiconductor laser device, it is possible to lower the threshold carrier density by use of a quantum well having a particularly great lattice constant or by use of a quantum well having a lattice constant difference of +0.5 to 5%. This is because the effective mass of holes is reduced on an equivalent basis in the strained system, thereby increasing the optical gain and, as a result, enabling oscillation with an injected carrier density of about 3 to $7 \times 10^{17}$ cm$^{-3}$. This condition is shown in FIG. 12. Because the laser oscillation is realized at the low carrier density, the applied electric field is not canceled. It is therefore possible to control the spatial overlap of the wave functions of electrons and holes, and to achieve an ultra high speed optical modulation by an electric field, as shown in FIGS. 2A and 2B. Electrodes for applying the electric field are so formed as to enable application of the electric field to the strained super lattice type quantum well layer. For instance, at least one pair of electrodes may be disposed respectively on the upper and lower sides of the strained super lattice type quantum well layer.

Figure 11:
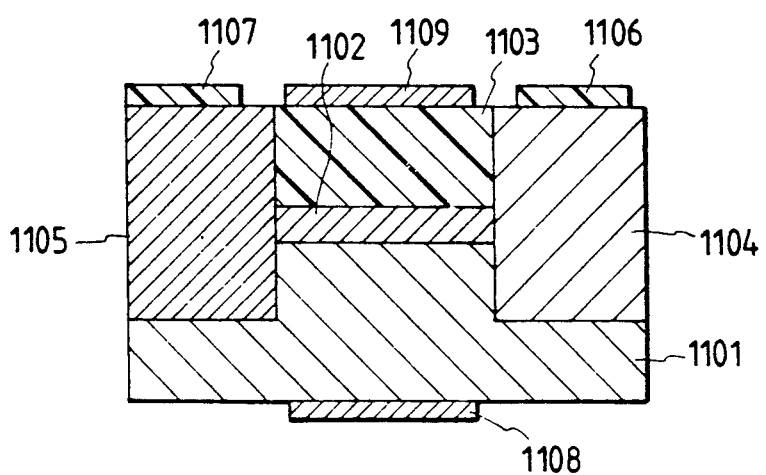
FIG. 11 is a sectional view for illustrating a further embodiment of the present invention.

This embodiment of the present invention will now be explained referring to the drawing. In FIG. 11, a 60-Å thick InGaAs strained quantum well layer 1102 having a lattice constant greater than the lattice constant of InP by 1.5% and a semi-insulating InP clad layer 1103 are grown on a semi-insulating InP substrate 1101, followed by formation of a projected stripe with 1 to 5 μm width by etching to such an extent as to pierce through the grown layers. Then, a p-InP buried layer 1104 and an n-InP buried layer 1105 are provided. Thereafter, a p-current injection electrode 1106, an n-current injection electrode 1107 are provided, and electrodes for applying electric field 1108 and 1109 are formed respectively on the face side and the bottom side. Finally, the system thus produced is cleaved to obtain a cavity length of 100 to 500 μm.

The semiconductor laser device produced as above on an experimental basis performs laser oscillation with 5 to 10 mA. When the electrode for applying electric field 1108 is grounded and a voltage of 2V is applied to the electrode 1109 during laser oscillation at an optical output power of 5 mW, the laser oscillation ceases and the optical output power is reduced to zero. Thus, it is possible to modulate the intensity of laser output power according to the presence or absence of an electric field applied to the electrode 1109. The switching speed in this case is about 5 ps, the value being restricted by the CR time constant of the device.

Figure 13:
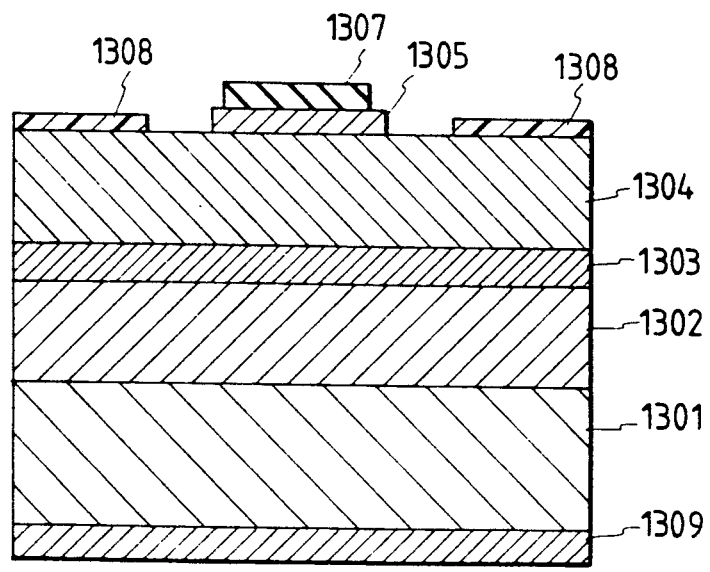
FIG. 13 is a sectional view of yet another embodiment of the invention.

Yet another embodiment of the semiconductor laser device according to the present invention is illustrated in FIG. 13. This embodiment has a structure resembling a two-dimensional electron gas hetero-bipolar transistor comprising an emitter, a base and a collector. After a p-GaAlAs layer 1302, a 100-Å thick InGaAlAs strained quantum well layer 1303 having a lattice constant greater than the lattice constant of GaAlAs by 2.5%, an n-GaAlAs 1304 and a p-GaAs 1305 are grown on a p-GaAs substrate 1301, an emitter electrode 1307 is provided. Next, the emitter electrode 1307 and the p-GaAs 1305 in the other regions than the above are removed, followed by formation of a base electrode 1308 and formation of a collector electrode 1309 on the lower side. In this device, the application of an electric field to the strained quantum well is carried out based on the presence or absence of a voltage applied to the collector electrode 1309. Carrier injection into the strained quantum well is effected through the emitter and base electrodes, and a modulation of the intensity of laser output power similar to the modulation in the above-mentioned embodiment is achieved.

Referring again to FIG. 7, an explanation will be given of an embodiment in which the semiconductor laser device 707 according to the present invention, having a strained super lattice active structure, is applied to optical communication. The semiconductor laser device 707 shown in FIG. 11 or FIG. 13 is connected with a carrier injection electrode 708 and a signal generator for applying an electric field 709. Laser light 730 modulated by the optical device 707 is transmitted through an optical fiber 731, and an optical output 732 from the fiber 731 is converted by an optical detector 706 into an electric signal, which is discriminated by a receiver 705. In this embodiment, also, it is possible to realize a transmission speed of 100 Gbit/s and a fiber length of 40 km.

Although the present invention has been described with reference to an ordinary double hetero semiconductor laser device, it is to be appreciated that other semiconductor laser devices are applicable, including a buried hetero semiconductor laser device, a distributed Bragg reflection semiconductor laser device, a distributed feedback semiconductor laser device, and the like.

The invention has been described with reference to the preferred embodiments. Obviously, modifications and alterations will occur to those of ordinary skill in the art upon reading and understanding the present specification. It is intended that the invention be construed as including all such alterations and modifications in so far as they come with the scope of the appended claims or the equivalent thereof.

What is claimed is:

1. A semiconductor laser device comprising an active region for radiating light, means for injecting carriers into the active region, and a resonator for obtaining laser light from the radiated light, the active region having a potential well, the potential well comprising a region which does not fulfill the charge neutrality condition for free-carriers, and the optical output power of the device being reduced by applying an electric field in such a direction as to enlarge the distance between the position of electrons localized in the potential well and the position of holes localized in the potential well.

2. The semiconductor laser device as set forth in claim 1, further comprising means for applying an electric field to the active region.

3. The semiconductor laser device as set forth in claim 1, wherein the region which does not fulfill the charge neutrality condition for free-carriers is formed by selective introduction of a conductivity type impurity into the potential well.

4. The semiconductor laser device as set forth in claim 1, wherein a condition for not fulfilling the charge neutrality condition for free-carriers is established based on unsymmetricity of the shape of the potential well.

5. The semiconductor laser device as set forth in claim 1, wherein the region which does not fulfill the charge neutrality condition for free-carriers is formed by selective introduction of a conductivity type impurity into the vicinity of the potential well in the active region.

6. A semiconductor laser device comprising an active region for radiating light, means for injecting carriers into the active region, and a resonator for obtaining laser light from the radiated light, the active region having a potential well, the potential well comprising a region which does not fulfill the charge neutrality condition for free-carriers, and optical output power of the device being modulated by applying an electric field to the carriers in the potential well.

7. The semiconductor laser device as set forth in claim 6, wherein the region which does not fulfill the charge neutrality condition for free-carriers is formed by selective introduction of a conductivity type impurity into the potential well.

8. The semiconductor laser device as set forth in claim 6, wherein the conductivity type impurity is an n-type impurity.

9. A semiconductor laser device comprising an active region for radiating light, means for injecting carriers into the active region, and a resonator for obtaining laser light from the radiated light, a conductivity type impurity being introduced into the active region, whereby optical output power of laser is modulated by a modulated electric field applied to the active layer.

10. The semiconductor laser device as set forth in claim 9, wherein the conductivity type impurity is so introduced as to cancel a screening effect of the carriers present in the active region on the modulated electric field.

11. A semiconductor laser device having a resonant cavity, including an active region, and means for injecting carriers, in which the optical output power of light oscillated by injection of carriers is modulated by an applied electric field, wherein the optical output power is substantially eliminated by varying the magnitude of the applied electric field to enlarge the average distance between electrons and holes to be recombined in an active region.

12. The semiconductor laser device as set forth in claim 11, wherein the optical output power is modulated by the applied electric field while a substantially constant driving current in the vicinity of a threshold current for radiation of laser light is injected.

13. A semiconductor laser device comprising an active region, the active region having a potential well, the potential well comprising a region which does not fulfill the charge neutrality condition for free-carriers, means for injecting carriers into the active region to cause radiation of light, a resonator for obtaining laser light from the radiated light, and means for applying an electric field to the active region in order to modulate the radiation of the light.

14. A semiconductor laser device comprising an active region for radiating light, means for injecting carriers into the active region, a resonator for amplifying the light radiated from the active region, and means for applying a modulated electric field to the active region, the active region having a potential well which comprises electrons and holes, and the active region having a structure in which the distance between the position of electrons and the position of holes is varied in the potential well by the electric field applied from the electric field applying means.

15. The semiconductor laser device as set forth in claim 14, wherein the electric field applying means varies the spatial overlap of the wave functions which respectively describe the electrons and the holes, so as to control the radiation of light based on recombination of the carriers.

16. The semiconductor laser device as set forth in claim 14, wherein the threshold carrier density for laser oscillation of the active region has such a value as not to cause effective screening of the electric field applied from the electric field applying means.

17. A semiconductor laser device comprising a resonant cavity including an active layer for radiating light and a clad layer for optical confinement, on a semiconductor substrate, wherein the active layer has a structure which comprises at least one quantum well layer having a thickness not more than the de Broglie wavelength of electron and in which the lattice constant of the quantum well layer is different from the lattice constant of a barrier layer adjacent to the quantum well layer, namely, a strained super lattice type quantum well structure, and the semiconductor laser device further comprises at least one pair of electrodes for current injection capable of injecting carriers into the strained super lattice type quantum well layer, and electrodes for applying an electric field in the lamination direction of the strained super lattice type quantum layer.

18. The semiconductor laser device as set forth in claim 17, the device comprising a mirror comprising a cleaved facet as a resonator for feedback of light.

19. The semiconductor laser device as set forth in claim 17, wherein the lattice constant of the quantum well layer is greater than the lattice constant of the barrier layer by 0.5 to 5%.

20. The semiconductor laser device as set forth in claim 17, wherein the quantum well layer is an InGaAs layer, an InGaAsP layer or an InGaAlAs layer.

21. The semiconductor device as set forth in claim 17; the device comprising a grating provided in an optical guide layer adjacent to at least one of the upper and lower ends of the active layer.

* * * * *

UNITED STATES PATENT AND TRADEMARK OFFICE
CERTIFICATE OF CORRECTION

PATENT NO. : 5,073,892
DATED : December 17, 1991
INVENTOR(S) : Kazuhisa Uomi, et al It is certified that error appears in the above-identified patent and that said Letters Patent is hereby corrected as shown below:

Column 3, line 2 , after "free-carriers" insert --,--.

Column 3, line 29, After "devising" insert --the--.

Column 5, line 57, Change " $|(n_0 + n_1) - (p_0 + p_1)$ " to -- $|(n_0 + n_1) - (p_0 + p_1)$ --.

Column 5, line 59 After "that" delete "an".

Column 6, line 30, Change "molulation" to --modulation--.

Signed and Sealed this

Twenty-fifth Day of May, 1993

Attest:

MICHAEL K. KIRK

Attesting Officer

Acting Commissioner of Patents and Trademarks

UNITED STATES PATENT AND TRADEMARK OFFICE
CERTIFICATE OF CORRECTION

PATENT NO. : 5,073,892
DATED : December 17, 1991
INVENTOR(S) : Kazuhisa Uomi, et al It is certified that error appears in the above-identified patent and that said Letters Patent is hereby corrected as shown below:

Column 3, line 2 , after "free-carriers" insert --,--.

Column 3, line 29, After "devising" insert --the--.

Column 5, line 57, Change " $|(n_0+ n_1) - (p_0+ p_1)|$ " to -- $|(n_0+ n_1) - (p_0+ p_1)|$ --.

Column 5, line 59 After "that" delete "an".

Column 6, line 30, Change "molulation" to --modulation--.

This certificate supersedes Certificate of Correction issued May 25, 1993.

Signed and Sealed this

First Day of February, 1994

Attest:

BRUCE LEHMAN

*Attesting Officer*    *Commissioner of Patents and Trademarks*